United States Patent
Lawson et al.

(10) Patent No.: US 8,411,490 B2
(45) Date of Patent: Apr. 2, 2013

(54) SENSE AMPLIFIER FOR STATIC RANDOM ACCESS MEMORIES

(75) Inventors: David C. Lawson, Haymarket, VA (US); Edward Maher, Manassas, VA (US); Shankarnarayana Ramaswamy, Chantilly, VA (US); Tri Minh Hoang, Clifton, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 1999 days.

(21) Appl. No.: 10/890,430

(22) Filed: Jul. 10, 2004

(65) Prior Publication Data

US 2006/0023614 A1 Feb. 2, 2006

(51) Int. Cl.
*G11C 11/00* (2006.01)
(52) U.S. Cl. .................................................... 365/154
(58) Field of Classification Search .................. 365/154, 365/185.21, 205, 207
See application file for complete search history.

(56) References Cited

U.S. PATENT DOCUMENTS

| | | | | |
|---|---|---|---|---|
| 5,552,728 A | * | 9/1996 | Lin | 327/57 |
| 5,650,971 A | * | 7/1997 | Longway et al. | 365/207 |
| 6,091,654 A | * | 7/2000 | Forbes et al. | 365/208 |
| 6,754,121 B2 | * | 6/2004 | Worley | 365/207 |

OTHER PUBLICATIONS

PCT International Search Report dated Jun. 22, 2006 of International Application No. PCT/US05/23904 filed Jul. 6, 2005.

* cited by examiner

*Primary Examiner* — Anthan Tran
(74) *Attorney, Agent, or Firm* — Yudell Isidore Ng Russell PLLC; Anthony Ng

(57) ABSTRACT

A sense amplifier for static random access memories is disclosed. The sense amplifier includes a pair of inverters cross-coupled to each other. The sense amplifier also includes means for equalizing the charges within the pair of inverters before performing a sense operation, and means for sensing a current difference between a bitline and its complement from a memory cell during the sense operation.

5 Claims, 3 Drawing Sheets

US 8,411,490 B2

SENSE AMPLIFIER FOR STATIC RANDOM ACCESS MEMORIES

The present invention was made under government contract DSWA01-96-C-0106.

BACKGROUND OF THE INVENTION

1. Technical Field

The present invention relates to memory circuits in general, and in particular to static random access memory circuits. Still more particularly, the present invention relates to a sense amplifier circuit for static random access memory circuits.

2. Description of Related Art

In general, memory cells within a static random access memory (SRAM) are connected to a set of bitline pairs BL and *BL. Each of the memory cells is also connected to a wordline WL disposed in the direction perpendicular to the bitline pairs. The data in each of the memory cells appears as an extremely small voltage difference between the corresponding bitline pair connected to the memory cell. Such voltage difference is typically in the range of several tens of a millivolt, and a sense amplifier is commonly utilized to differentially amplify the small voltage difference.

Referring now to the drawings and in particular to FIG. 1, there is depicted a circuit diagram of a sense amplifier according to the prior art. As shown, a latch-type sense amplifier 10 includes p-channel transistors 11-12 and n-channel transistors 13-15. A small potential difference between a bitline pair BL and *BL is sent to output nodes OUT and *OUT via transistors 13 and 14, respectively. When the logic level of BL is high while the logic level of *BL is low, transistor 13 eventually turns on and transistor 15 turns off. Thus, a logic high voltage appears at the output node on the $V_{cc}$ side of transistor 14, and a logic low voltage appears at the output node on the $V_{cc}$ side of transistor 13. Such voltage difference is positively fed back by transistors 11 and 12, and is sent to the output nodes OUT and *OUT as complementary signals. When sense amplifier 10 outputs the complementary signals, an enable signal having a voltage equal to the power supply voltage $V_{cc}$ is applied to the gate of transistor 15 to maintain transistor 15 being turned on.

Conventional sense amplifiers, such as latch-type sense amplifier 10, tend to be relatively slow because the bitline pair BL and *BL has a relatively large capacitive load, depending on the array size. Such relative high capacitive load hinders the development of a sufficiently acceptable differential signal between BL and *BL. Consequently, it would be desirable to provide a sense amplifier circuit that can operate in a relatively high speed.

SUMMARY OF THE INVENTION

In accordance with a preferred embodiment of the present invention, a sense amplifier includes a pair of inverters cross-coupled to each other. The sense amplifier also includes means for equalizing the charges within the pair of inverters before performing a sense operation, and means for sensing a current difference between a bitline and its complement from a memory cell during the sense operation.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
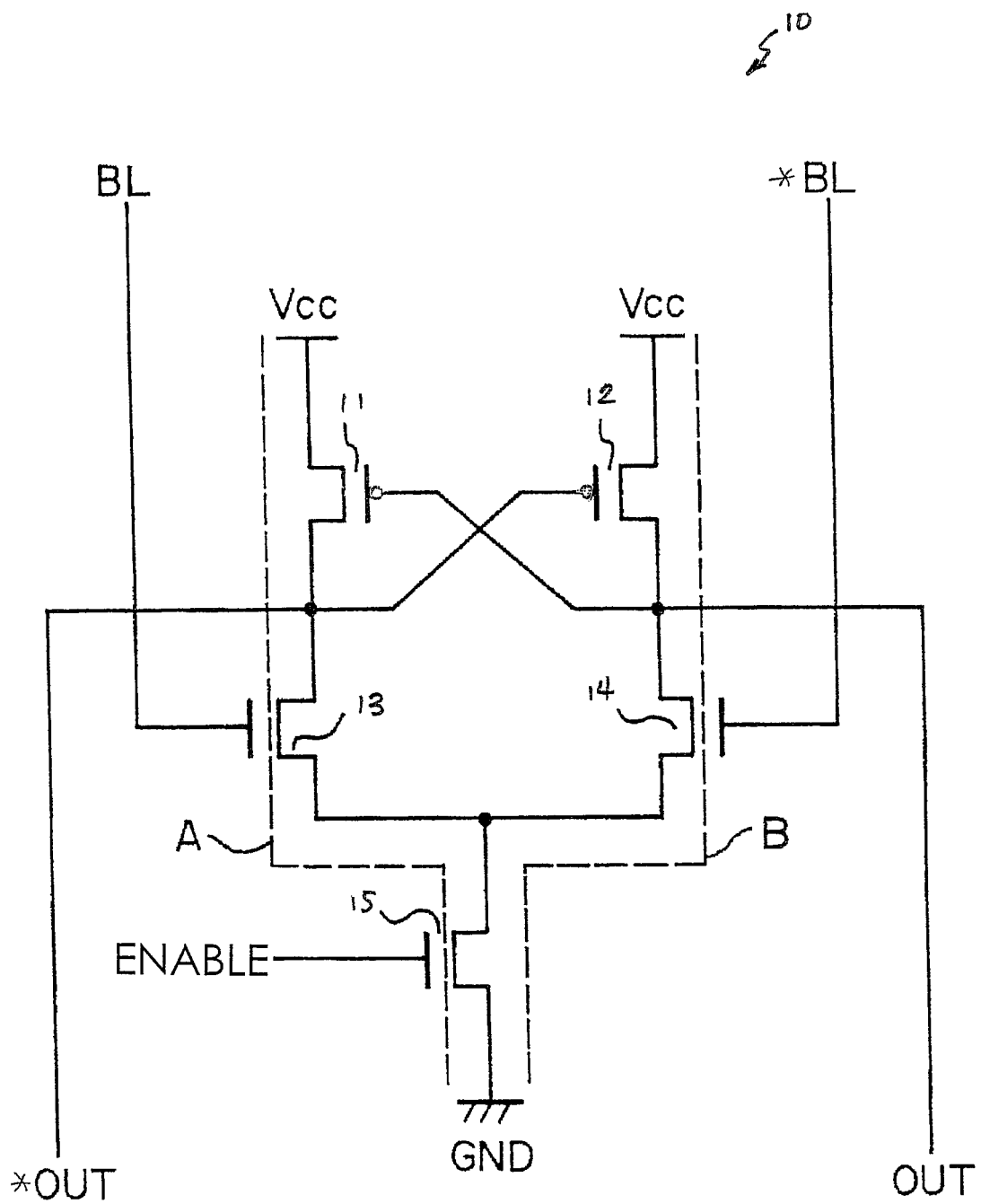
FIG. 1 is a circuit diagram of a sense amplifier according to the prior art.
Figure 2:
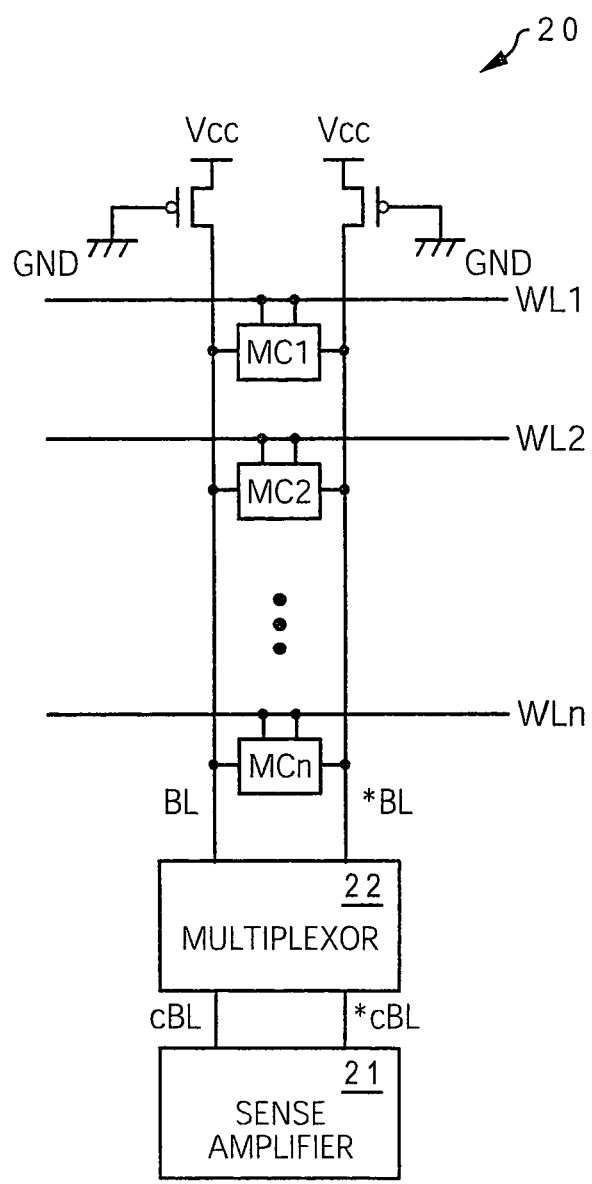
FIG. 2 is a block diagram of a static random access memory in which a preferred embodiment of the present embodiment is applicable.

With reference now to FIG. 2, there is illustrated a block diagram of a static random access memory (SRAM) 20 in which a preferred embodiment of the present embodiment is applicable. Although. SRAM 20 generally includes multiple columns of memory cells, only one of the columns is shown in FIG. 2 for the sake of simplicity. As shown, memory cells MC1 to MCn are coupled to a sense amplifier 21 via a multiplexer 22. Memory cells MC1 to MCn are connected between a bitline pair BL and *BL. Each of memory cells MC1 to MCn is also connected to a corresponding one of wordlines WL1 to WLn disposed in the direction perpendicular to bitline pair EL and *BL. Multiplexor 22 multiplexes all the bitline pairs of SRAM 20 into one common bitline pair cBL and *cBL.

Any one of memory cells MC1 and MCn can be selected by setting a corresponding one of wordlines WL1 to WLn to a logic high level, and holding the remaining wordlines to a logic low level. Depending on the binary data stored in the selected memory cell, the power supply voltage $V_{cc}$. appears on one of common bitline pair cBL and *cBL and a voltage slightly lower than $V_{cc}$ appears on the other one of common bitline pair cBL and *cBL. Such voltage difference is differentially amplified by sense amplifier 21.

Figure 3:
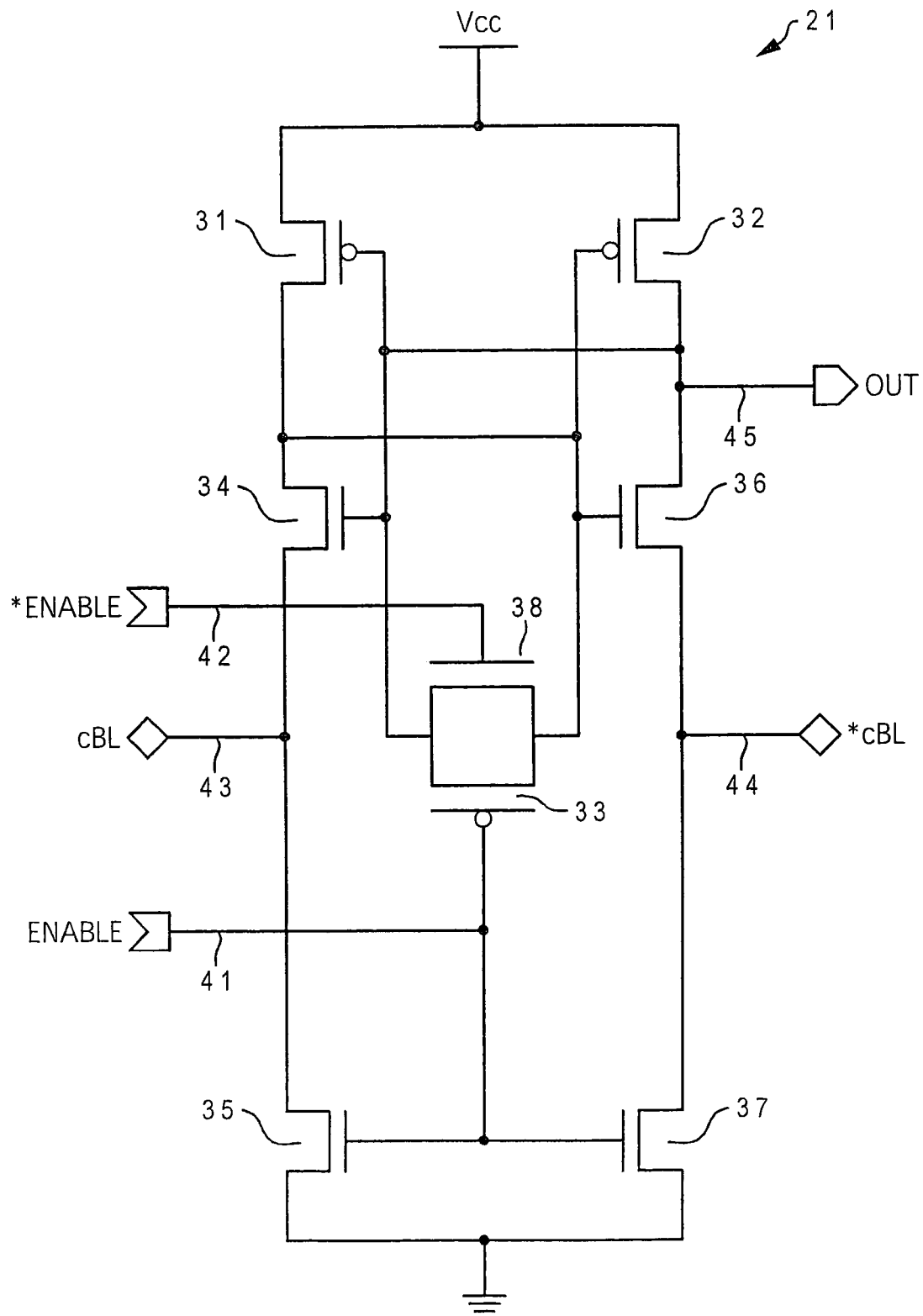
FIG. 3 is a circuit diagram of a sense amplifier utilized within the static random access memory in FIG. 2, in accordance with a preferred embodiment of the present invention.

Referring now to FIG. 3, there is depicted a circuit diagram of sense amplifier 21, in accordance with a preferred embodiment of the present invention. As shown, sense amplifier 21 includes p-channel transistors 31-33 and n-channel transistors 34-38. Transistors 31 and 34-35 are connected in series between a power supply $V_{cc}$ and ground. Similarly, transistors 32 and 36-37 are connected in series between a power supply $V_{cc}$ and ground. The gates of transistors 31 and 34 are connected to a node between transistors 32 and 36. Similarly, the gates of transistors 32 and 36 are connected to a node between transistors 31 and 34.

Basically, a first inverter formed by transistors 31 and 34 is cross-coupled to a second inverter formed by transistors 32 and 36. The gates of transistors 31 and 34 are also coupled to the gates of transistors 32 and 36 via a transmission gate that is formed by transistors 33 and 38.

Sensor amplifier 21 can be activated or inactivated through an enable input 41 and *enable input 42 (i.e., complement of enable input 41) connected to the gates of transistors 33 and 38, respectively. Before performing a sensing operation, sensor amplifier 21 is inactivated by having enable input 41 at a logic low level and *enable input 42 at a logic high level. At such point, transistors 33 and 38 are turned on while transistors 35 and 37 are turned off. As a result, the potentials at the gates of transistors 31-32, 34 and 36 and the potentials at the drains of transistors 34 and 36 are equalized to a predetermined voltage $V_{cc} - V_t$, where $V_t$ is the threshold voltage of transistors 34 and 36. Accordingly, the potentials of a common bitline pair cBL 43 and *cBL 44 connected to the drains of transistors 34 and 36, respectively, are also equalized to $V_{cc}-V_t$.

During a sensing operation, sensor amplifier 21 is activated by having enable input 41 at a logic high level and *enable input 42 at a logic low level. At such point, transistors 33 and 38 are turned off while transistors 35 and 37 are turned on. As a result, sense amplifier 21 begins to detect the current flow through common bitline pair cBL 43 and *cBL 44 accordingly.

Current is sourced from a selected memory cell within SRAM 20 (from FIG. 2) and, to a certain degree, through transistors 31-38 that form sense amplifier 21. If the data stored in a selected memory cell is a logic "1," then some of the current to transistor 35 is sourced from cBL 43, which leads to less current coming from transistors 31 and 34 when compared with corresponding transistors 32 and 36. Thus, the potential at the node between transistors 31 and 34 is higher than the potential at the node between transistors 32 and 36. Consequently, transistor 32 will be turned off more and transistor 36 will be turned on more. As a result, OUT 45 outputs a logic "0."

If the data stored in a selected memory cell is a logic "0," then some of the current to transistor 37 is sourced from cBL 44, which leads to less current coming from transistors 32 and 36 when compared with corresponding transistors 31 and 34. Thus, the potential at the node between transistors 32 and 36 is higher than the potential at the node between transistors 31 and 34. Consequently, transistor 32 will be turned on more and transistor 36 will be turned off more. As a result, OUT 45 outputs a logic "1."

As has been described, the present invention provides a sense amplifier circuit for SRAMs. The sense amplifier of the present invention preserves the GND+$V_t$ precharge level of any SRAM, thus eliminating the potential of introducing addition timing related problems. The internal nodes of the sense amplifier of the present invention are biased to $V_{cc}-V_t$ before performing a sensing operation, thus enabling a rapid recovery in the event of a transient upset. Current is sourced (or sunk) from a memory cell within a SRAM during operation and is otherwise fully complementary when activated. The GND+$V_t$ precharge level is maintained, thus the power consumption of bitline restore is less than many prior art sense amplifiers.

While the invention has been particularly shown and described with reference to a preferred embodiment, it will be understood by those skilled in the art that various changes in form and detail may be made therein without departing from the spirit and scope of the invention.

What is claimed is:

1. A sense amplifier comprising:
    a first inverter having a first p-channel transistor and a first n-channel transistor;
    a second inverter having a second p-channel transistor and second n-channel transistor, wherein gates of said second transistors are connected to drains of said first transistors, and drains of said second transistors are connected to gates of said first transistors, wherein a source of said first n-channel transistor is connected to a bitline, and a source of said second n-channel transistor is connected to a complement bitline; and
    a transmission gate for equalizing said first and second inverters to a predetermined voltage before performing a sense operation, wherein said transmission gate is connected to said gates of said first and second transistors, wherein said transmission gate is formed by a p-channel transistor having its gate connected to an enable signal and an n-channel transistor having its gate connected to a complement enable signal;
    a third transistor connected between a source of said first n-channel transistor and ground, and a fourth transistor connected between a source of said second n-channel transistor and ground, wherein gates of said third and fourth transistors are connected to a gate of said p-channel transistor of said transmission gate.

2. The sense amplifier of claim 1, wherein said predetermined voltage is $V_{cc}-V_t$.

3. A static random access memory comprising:
    a plurality of memory cells connected to a plurality of bitline pairs;
    a multiplexor for multiplexing said plurality of bitline pairs to a common bitline pair; and
    a sense amplifier connected to said common bitline pair, wherein said sense amplifier includes
        a first inverter having a first p-channel transistor and a first n-channel transistor;
        a second inverter having a second p-channel transistor and second n-channel transistor, wherein gates of said second transistors are connected to drains of said first transistors, and drains of said second transistors are connected to gates of said first transistors, wherein a source of said first n-channel transistor is connected to a bitline, and a source of said second n-channel transistor is connected to a complement bitline; and
        a transmission gate for equalizing said first and second inverters to a predetermined voltage before performing a sense operation, wherein said transmission gate is connected to said gates of said first and second transistors, wherein said transmission gate is formed by p-channel transistor having its gate connected to an enable signal and an n-channel transistor having its gate connected to a complement enable signal;
        a third transistor connected between a source of said first n-channel transistor and ground, and a fourth transistor connected between a source of said second n-channel transistor and ground, wherein gates of said third and fourth transistors are connected to a gate of said p-channel transistor of said transmission gate.

4. The static random access memory of claim 3, wherein said predetermined voltage is $V_{cc}-V_t$.

5. The static random access memory of claim 3, wherein gates of said third and fourth transistors are connected to a gate of said p-channel transistor of said transmission gate.

* * * * *